(12) United States Patent
Pasterczyk et al.

(10) Patent No.: US 11,309,123 B2
(45) Date of Patent: Apr. 19, 2022

(54) FULLY INTEGRATED INVERSELY WEAKLY COUPLED POWER INDUCTOR

(71) Applicant: SCHNEIDER ELECTRIC IT CORPORATION, Foxboro, MA (US)

(72) Inventors: Robert Pasterczyk, Froges (FR); Eric Lucien Brun, Sassenage (FR)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 17/115,883

(22) Filed: Dec. 9, 2020

(65) Prior Publication Data

US 2021/0210278 A1    Jul. 8, 2021

Related U.S. Application Data

(60) Provisional application No. 62/957,840, filed on Jan. 7, 2020.

(51) Int. Cl.
| | |
|---|---|
| *H01F 27/38* | (2006.01) |
| *H02M 7/493* | (2007.01) |
| *H01F 27/30* | (2006.01) |
| *H01F 27/06* | (2006.01) |
| *H02M 1/12* | (2006.01) |

(Continued)

(52) U.S. Cl.
CPC .......... *H01F 27/306* (2013.01); *H01F 27/06* (2013.01); *H01F 27/385* (2013.01); *H02M 1/126* (2013.01); *H02M 7/493* (2013.01); *H02M 7/53871* (2013.01); *H02M 1/0064* (2021.05); *H02M 1/0074* (2021.05)

(58) Field of Classification Search
CPC .............................. H02M 7/493; H01F 27/385

USPC .................... 336/170, 192, 198, 212; 363/71
See application file for complete search history.

(56) References Cited

U.S. PATENT DOCUMENTS

| | | | |
|---|---|---|---|
| 4,910,482 A | 3/1990 | Takagai et al. | |
| 10,163,562 B2 * | 12/2018 | Fu | ........................ H02M 7/493 |

(Continued)

FOREIGN PATENT DOCUMENTS

| | | |
|---|---|---|
| JP | H10163046 A | 6/1998 |
| WO | 2018093848 A1 | 5/2018 |
| WO | WO-2018093848 A1 * 5/2018 | ............ H02M 1/126 |

OTHER PUBLICATIONS

Extended European Search Report from corresponding European Application No. 20215202.1 dated Jun. 10, 2021.

*Primary Examiner* — Gary A Nash
(74) *Attorney, Agent, or Firm* — Lando & Anastasi, LLP

(57) ABSTRACT

A filter assembly includes a first self-inductance core, a second self-inductance core, a coupled inductor core, and a first plurality of inductor coil windings. Each of the first plurality of inductor coil windings has a series of first turns in a vertically stacked relation around the first self-inductance core, and a series of second turns in a vertically stacked relation around the first self-inductance core and the coupled inductor core. The filter assembly further includes a second plurality of inductor coil windings. Each of the second plurality of inductor coil windings has a series of first turns in a vertically stacked relation around the second self-inductance core, and a series of second turns in a vertically stacked relation around the second self-inductance core and the coupled inductor core.

18 Claims, 11 Drawing Sheets

(51) Int. Cl.
*H02M 7/5387* (2007.01)
*H02M 1/00* (2006.01)

(56) References Cited

U.S. PATENT DOCUMENTS

| | | | | |
|---|---|---|---|---|
| 2009/0267718 A1* | 10/2009 | Nagano | ................ | H01F 27/006 336/65 |
| 2013/0010399 A1* | 1/2013 | Dziubek | ............... | H01F 27/323 361/268 |
| 2014/0340186 A1* | 11/2014 | Xianfeng | .............. | H01F 27/306 336/180 |
| 2015/0123402 A1 | 5/2015 | Wagoner et al. | | |

* cited by examiner 3-level NPC Inverter Leg

Dual-based 4-level Inverter Leg

FULLY INTEGRATED INVERSELY WEAKLY COUPLED POWER INDUCTOR

CROSS-REFERENCE TO RELATED APPLICATION

This application claims the benefit under 35 U.S.C. § 119(e) of U.S. Provisional Patent Application No. 62/957,840 titled FULLY INTEGRATED INVERSELY WEAKLY COUPLED POWER INDUCTOR filed on Jan. 7, 2020, which is herein incorporated by reference in its entirety for all purposes.

BACKGROUND

Field of Invention

Embodiments of the present disclosure relate generally to utility scale power inverters.

Discussion of Related Art

A power inverter, or inverter, is an electronic device or circuitry that converts direct current (DC) to alternating current (AC). Inverters may be used in a number of different contexts, with different DC power sources (such as lead acid batteries, photovoltaic solar panels, wind turbines, etc.), and may be designed to satisfy different power demands of a system. For example, an inverter may be bidirectional for battery recharge or when loads are on a DC side of the inverter, e.g., microgrid applications.

Utility scale solar inverters, in particular, convert variable DC output of a photovoltaic (PV) solar panel into a utility frequency AC to provide power to either a commercial electrical grid or a local, off-grid electrical network. Solar inverters are connected to a plurality of photovoltaic cells that provide DC input to the inverter. The inverter comprises at least one DC-to-AC power conversion bridge, associated filter electronics and an AC (output) module. The DC-to-AC power conversion bridge uses a plurality of electronic switches, typically insulated gate bipolar transistors (IGBTs), and diodes to convert the DC input into AC output. For grid-connected inverters providing power to an electricity grid, the AC output is filtered to provide an AC output waveform that is suitable for the grid. Furthermore, solar power inverters have special functions adapted for use with photovoltaic arrays, including maximum power point tracking and anti-islanding protection.

A sine wave inverter produces a multiple-step sinusoidal AC waveform, although in most cases the output is a choppy or rough approximation of a sine wave, rather than a smooth sine wave. As a substitute for standard AC line power, power inverter devices approximate a sine wave output because many electrical products are engineered to work best with a sine wave AC power source. Further, grid-connected inverters can be designed to feed power into the electric power distribution system or to converters used in grid forming applications of energy storage systems. They transfer synchronously with the line, and should have as little harmonic content as possible.

Examples of such power inverters can be found in PCT Application No. PCT/US2017/061727, filed Nov. 15, 2017 and titled "COMPACT AC FILTER MODULE FOR INTERLEAVED POWER CONVERTER," which is incorporated herein by reference in its entirety.

Switching power converters, such as the ones described above, are built to transform the electrical energy and regulate or stabilize its electrical parameters like voltage, current, frequency. Switching operation means generation of PWM/PPM (pulse width/pulse position modulated) waveforms, which have to be filtered in order to match AC LF (low frequency 50-60 Hz) energy transmission. Conventional filters are formed by passive components forming low-pass filters mainly simple LC or LCL. Such low-pass filters allow the fundamental component of the waveform to pass to the output while limiting the passage of all higher harmonic components.

The output from an AC converter can be single-phase or three-phase. Three-phase inverters are generally used in higher power applications. A basic three-phase inverter consists of three single-phase legs each connected to one of the three load terminals. The operation of the three-phase legs is coordinated so that one operates at each 120-degree point of the fundamental output waveform. Certain harmonics are eliminated, and other harmonics can be removed by further processing. To achieve novel more efficient filtering per phase based on coupled inductor principle three conditions should be fulfilled:

bridge of the converter is built with at least two switching semiconductors legs or two separate bridges intended to be put in parallel and work on common filter;

separate legs or bridges are driven by interleaved control signals. Interleaving is implemented by phase-shifting the switching times of each leg by a unique multiple of 360°/n, where n is the number of legs. The switching of the multiple inverters is thereby staggered, and the overall switching frequency is apparently increased (n times relative to the output of each individual inverter). For example, with two shifted legs with their outputs phase-shifted by 180°, the effective switching frequency will double. This technique is mainly known to decrease ripple current in the filter capacitors but rarely used; and filtering chokes should be partially coupled between them with special design and implantation compared to the wide used classic solution. Not only self-inductance is required for filtering purposes, but also mutual inductance should be created and implemented into the filter circuit.

There are many different kinds, structures and topologies of electrical converters; embodiments of the present disclosure can apply to five families of medium and high-power converters:

input filters of AC to DC paralleled bridges, PFC input stages, boosts with current sinusoidal absorption, which can be 2-level bipolar PWM/PPM (pulse width/pulse position modulated), 3-level unipolar PWM or multilevel PWMs, such as 4-level, 5-level or more;

output filters of DC to AC paralleled bridges voltage inverters, current inverters including solar converters which can be 2-level bipolar PWM, 3-level unipolar PWM or multilevel PWMs 4 level, 5-level or more;

output filters of DC to DC paralleled legs including boost, buck and boost/buck structures;

AC to AC Converters with DC link including UPSs which can be bidirectional; and output filters of active filters (harmonics cancelling converters).

Converters generally used to low-pass filter the polypropylene capacitors and single classic inductors are widely used. Also, series/parallel connections of separated non-coupled inductors is often employed to match the rated power of the converter. Application of coupled inductors is very limited and based on principle of leakage flux increasing in the classical transformer built. It is mainly achieved by splitting the windings or shunt insertion in the main transformer core to amplify self-inductance leakage flux to the needed value.

SUMMARY

One aspect of the present disclosure is directed to a filter assembly comprising a first self-inductance core, a second self-inductance core, a coupled inductor core, and a first plurality of inductor coil windings. Each of the first plurality of inductor coil windings has a series of first turns in a vertically stacked relation around the first self-inductance core, and a series of second turns in a vertically stacked relation around the first self-inductance core and the coupled inductor core. The filter assembly further comprises a second plurality of inductor coil windings. Each of the second plurality of inductor coil windings has a series of first turns in a vertically stacked relation around the second self-inductance core, and a series of second turns in a vertically stacked relation around the second self-inductance core and the coupled inductor core.

Embodiments of the filter assembly further may include configuring the first self-inductance core, the second self-inductance core, and the coupled inductor core to each include three limbs, one limb for each of three phases. The second turns of each of the first plurality of inductor coil windings may be elongated turns and the second turns of each of the second plurality of inductor coil windings may be elongated turns. The second turns of each of the first plurality of inductor coil windings and the second turns of each of the second plurality of inductor coil windings may be positioned at a middle of the coil winding. The second turns of each of the first plurality of inductor coil windings and the second turns of each of the second plurality of inductor coil windings may be every other turn. The first plurality of inductor coil windings may be configured to electrically connect to a first inverter at a first terminal to receive an alternating current output from the first inverter and the second plurality of inductor coil windings may be configured to electrically connect to a second inverter at a second terminal to receive an alternating current output from the second inverter. The first plurality of inductor coil windings may be electrically connected to the second plurality of inductor coil windings at a third terminal configured to provide a combined alternating current from the first and second inverter.

Another aspect of the disclosure is directed to an inductor coil winding comprising a first terminal and a series of first circular turns in a vertically stacked relation. The series of first circular turns leads in from the first terminal and has a diameter allowing for an opening within the series of first circular turns. The inductor coil winding further comprises a series of elongated turns in a vertically stacked relation. The series of elongated turns leads in from the series of first circular turns and has a length greater than the diameter of the series of circular turns, and allowing for an opening within the series of elongated turns. The inductor coil winding further comprises a series of second circular turns in a vertical stacked relation. The series of second circular turns leads in from the series of elongated turns and has a diameter allowing for an opening within the series of second circular turns. The openings of the first and second circular turns are aligned with one another. The inductor coil winding further comprises a second terminal, with the second terminal leading out form the series of second circular turns.

Embodiments of the inductor coil winding further may include configuring the series of first circular turns and the series of second circular turns to provide main inductance. The series of elongated turns may provide coupled inductance. The first terminal may be an input terminal electrically connected to an output of an inverter to receive current from the inverter. The inductor coil winding further may include a self-inductance core in the opening within the series of first circular turns and the series of second circular turns and a coupled core in the opening within the series of elongated turns. The coupled core may be configured to provide a magnetic coupling to another inductor coil winding. The series of elongated turns may be located at a middle of the inductor coil winding. The series of elongated turns may be achieved by every other turn.

Yet another aspect of the present disclosure is directed to a method of assembling a filter assembly. In one embodiment, the method comprises: interleaving a first inductor coil winding with a second inductor coil winding, each of the first and second inductor coil windings including a first terminal, a series of first circular turns in a vertically stacked relation, the series of first circular turns leading in from the first terminal and having a diameter allowing for an opening within the series of first circular turns, a series of elongated turns in a vertically stacked relation, the series of elongated turns leading in from the series of first circular turns and having a length greater than the diameter of the series of circular turns, and allowing for an opening within the series of elongated turns, a series of second circular turns in a vertical stacked relation, the series of second circular turns leading in from the series of elongated turns and having a diameter for allowing an opening within the series of second circular turns, the openings of the first and second circular turns being aligned with one another, and a second terminal, the second terminal leading out form the series of second circular turns; positioning a first self-inductance core in first and second openings of the first inductor coil winding; positioning a second self-inductance core in the first and second openings of the second inductor coil winding; and positioning a coupled inductor core in the opening within the series of elongated turns.

One aspect of the present disclosure is directed to a filter assembly comprising a first self-inductance core, a second self-inductance core, a coupled inductor core, and a first plurality of inductor coil windings. Each of the first plurality of inductor coil windings has a series of first turns in a vertically stacked relation around the first self-inductance core, and a series of second turns in a vertically stacked relation around the first self-inductance core and the coupled inductor core. The filter assembly further comprises a second plurality of inductor coil windings. Each of the second plurality of inductor coil windings has a series of first turns in a vertically stacked relation around the second self-inductance core, and a series of second turns in a vertically stacked relation around the second self-inductance core and the coupled inductor core.

Embodiments of the filter assembly further may include configuring the first self-inductance core, the second self-inductance core, and the coupled inductor core to each include three limbs, one limb for each of three phases. The second turns of each of the first plurality of inductor coil windings may be elongated turns and the second turns of each of the second plurality of inductor coil windings may be elongated turns. The second turns of each of the first plurality of inductor coil windings and the second turns of each of the second plurality of inductor coil windings may be positioned at a middle of the coil winding. The second turns of each of the first plurality of inductor coil windings and the second turns of each of the second plurality of inductor coil windings may be every other turn. The first plurality of inductor coil windings may be configured to electrically connect to a first inverter at a first terminal to receive an alternating current output from the first inverter and the second plurality of inductor coil windings may be configured to electrically connect to a second inverter at a second terminal to receive an alternating current output from the second inverter. The first plurality of inductor coil windings may be electrically connected to the second plurality of inductor coil windings at a third terminal configured to provide a combined alternating current from the first and second inverter.

Another aspect of the present disclosure is directed to an inductor coil winding comprising a first terminal and a series of first circular turns in a vertically stacked relation. The series of first circular turns lead in from the first terminal and has a diameter allowing for an opening within the series of first circular turns. The inductor coil winding further comprises a series of elongated turns in a vertically stacked relation. The series of elongated turns leads in from the series of first circular turns and has a length greater than the diameter of the series of circular turns, and allows for an opening within the series of elongated turns. The inductor coil winding further comprises a series of second circular turns in a vertical stacked relation. The series of second circular turns leads in from the series of elongated turns and has a diameter allowing for an opening within the series of second circular turns. The openings of the first and second circular turns are aligned with one another. The inductor coil winding further comprises a second terminal. The second terminal leads out form the series of second circular turns.

Embodiments of the inductor coil winding further may include the series of first circular turns and the series of second circular turns providing main inductance. The series of elongated turns may provide coupled inductance. The first terminal may be an input terminal electrically connected to an output of an inverter to receive current from the inverter. The inductor coil winding further may include a self-inductance core in the opening within the series of first circular turns and the series of second circular turns and a coupled core in the opening within the series of elongated turns, with the coupled core being configured to provide a magnetic coupling to another inductor coil winding. The series of elongated turns may be located at a middle of the inductor coil winding. The series of elongated turns may be achieved by every other turn.

Yet another aspect of the present disclosure is directed to a method of assembling a filter assembly. In one embodiment, the method comprises interleaving a first inductor coil winding with a second inductor coil winding. Each of the first and second inductor coil windings include a first terminal, a series of first circular turns in a vertically stacked relation, the series of first circular turns leading in from the first terminal and having a diameter allowing for an opening within the series of first circular turns, a series of elongated turns in a vertically stacked relation, the series of elongated turns leading in from the series of first circular turns and having a length greater than the diameter of the series of circular turns, and allowing for an opening within the series of elongated turns, a series of second circular turns in a vertical stacked relation, the series of second circular turns leading in from the series of elongated turns and having a diameter for allowing an opening within the series of second circular turns, the openings of the first and second circular turns being aligned with one another, and a second terminal, the second terminal leading out form the series of second circular turns. The method further comprises: positioning a first self-inductance core in first and second openings of the first inductor coil winding; positioning a second self-inductance core in the first and second openings of the second inductor coil winding; and positioning a coupled inductor core in the opening within the series of elongated turns.

Another aspect of the present disclosure is directed to a filter assembly comprising a first self-inductance core, a second self-inductance core, a coupled inductor core, and a first inductor coil winding having a series of first turns in a vertically stacked relation around the first self-inductance core and a series of second turns in a vertically stacked relation around the first self-inductance core and the coupled inductor core. The first inductor coil winding is wound in a first direction. The filter assembly further comprises a second inductor coil winding having a series of first turns in a vertically stacked relation around the second self-inductance core and a series of second turns in a vertically stacked relation around the second self-inductance core and the coupled inductor core. The second inductor coil winding is wound in a second direction, which is opposite the first direction. The filter assembly further comprises a third inductor coil winding having a series of first turns in a vertically stacked relation around the first self-inductance core and a series of second turns in a vertically stacked relation around the first self-inductance core and the coupled inductor core. The third inductor coil winding is wound in a first direction. The second inductor coil is positioned between the first inductor coil and the third inductor coil.

Embodiments of the filter assembly further may include the first self-inductance core, the second self-inductance core, and the coupled inductor core each including three limbs, one limb for each of three phases. The second turns of first inductor coil winding may be elongated turns and the second turns of the second inductor coil winding may be elongated turns. The second turns of the first inductor coil winding and the second turns of the second inductor coil winding may be positioned at a middle of the coil winding, and the second turns of the first inductor coil winding and the second turns of the second inductor coil winding may be every other turn. The first inductor coil winding may be configured to electrically connect to a first inverter at a first terminal to receive an alternating current output from the first inverter and the second inductor coil winding may be configured to electrically connect to a second inverter at a second terminal to receive an alternating current output from the second inverter.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, identical or nearly identical components illustrated in various figures may be represented by like numerals. For purposes of clarity, not every component may be labeled in every figure. In the figures.

DETAILED DESCRIPTION

Figure 1:
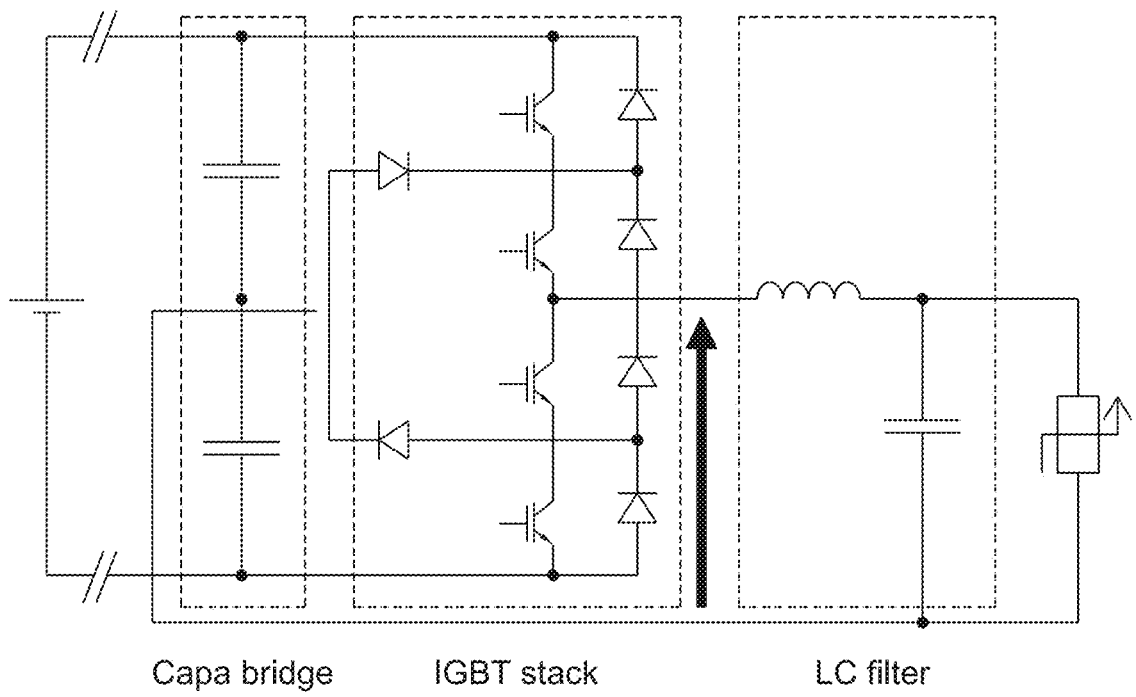
FIG. 1 is a schematic diagram of a single-phase inverter for 3-level bridge.

Aspects and embodiments provide inductor arrangements to couple two or more inverters in parallel, in an extremely compact configuration, with efficient use of magnetic inductor material (thereby reducing cost). Embodiments in accordance with principles of the disclosure can drastically reduce the overall AC filter size and cost, and can provide a filtered AC output quality suitable for the grid. A cooling system may be mechanically integrated into the compact AC filter module for thermal management in some embodiments.

It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Embodiments of the present disclosure provide two or more converter legs or bridges connected in parallel through an inversely coupled integrated inductor, in an extremely compact configuration, with efficient use of magnetic material in the inductor core as well conductor material in the inductor winding. This construction can drastically reduce the overall converter filter size and cost, and can provide a filtered converter output with outstanding quality regarding user's values.

The power bridge itself produces an unacceptably rough AC power waveform in the shape of high frequency pulses. Therefore, a low-pass filter, consisting of combination of inductances (L) and capacitances (C), is used to smooth the waveforms delivered to the load or utility. To handle the level of power and power quality requirements, this filter would conventionally be quite large and costly for high power systems. In classical approach to this problem, after much optimization requires filter inductors usually arrive on significant level of the total converter cost. The inductor used in the classical approach also produces significant energy losses which inflates the required cooling system and adds additional cost and volume to the system.

Figure 2:
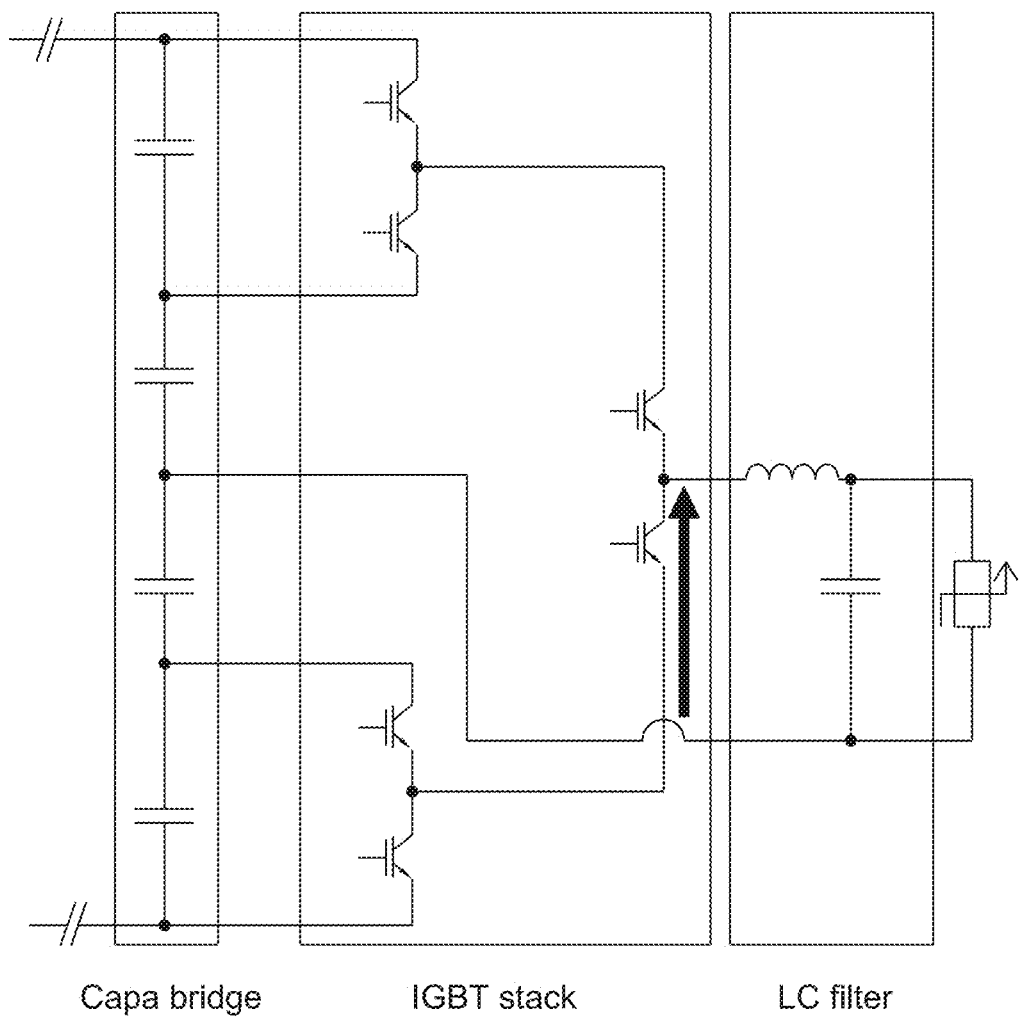
FIG. 2 is a schematic diagram of a two-phase inverter for 4-level bridge.

Following the principle of converters coupling through partially coupled inductors, which is shown in FIG. 1, single-phase unitary inverter legs for 3- and 4-level simple bridges with classic non-coupled inductors and associated waveforms are formed, which is shown in FIG. 2.

Figure 1A:
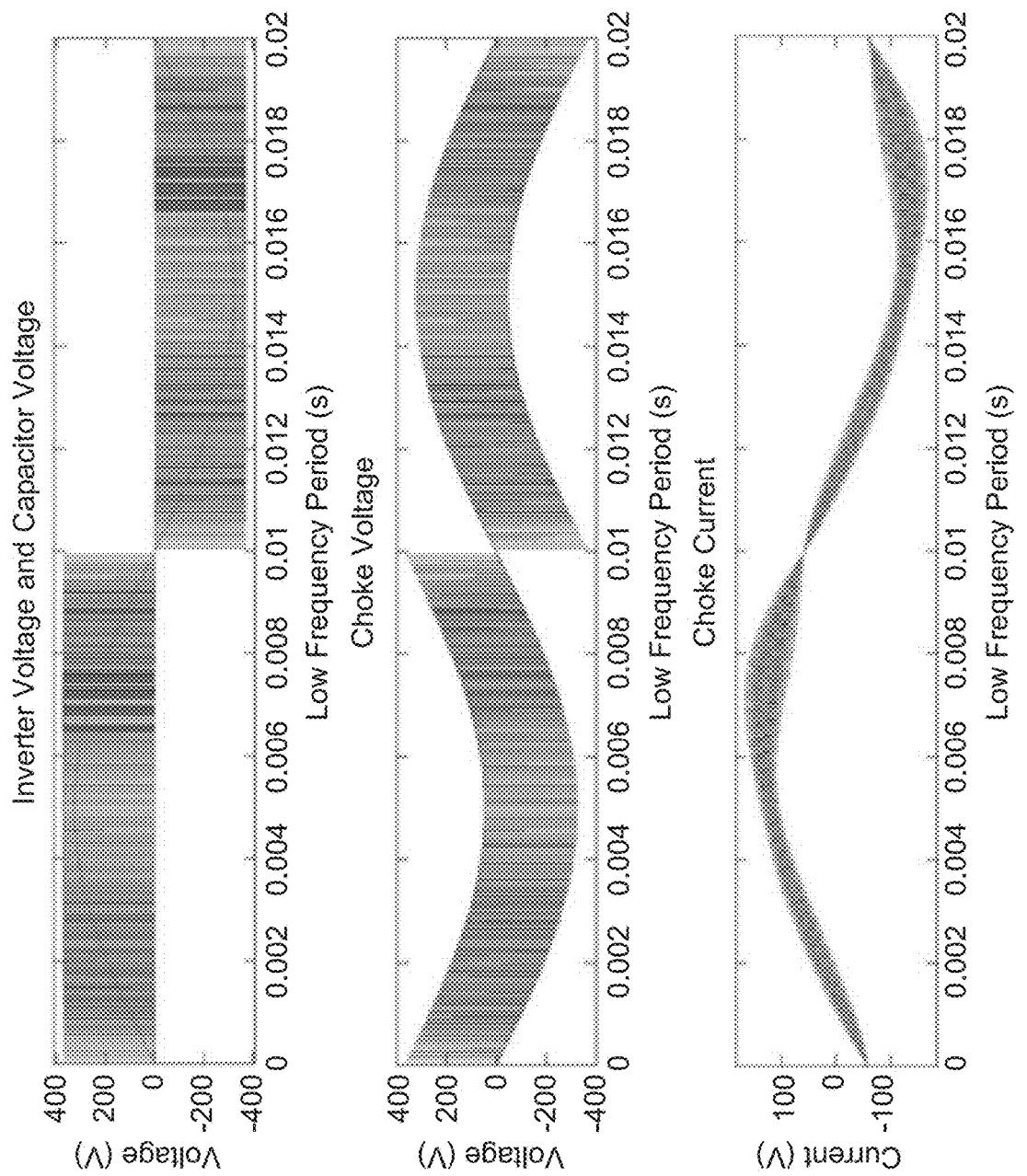
FIG. 1A is a graph showing a waveform of the single-phase inverter for 3-level bridge.
Figure 2A:
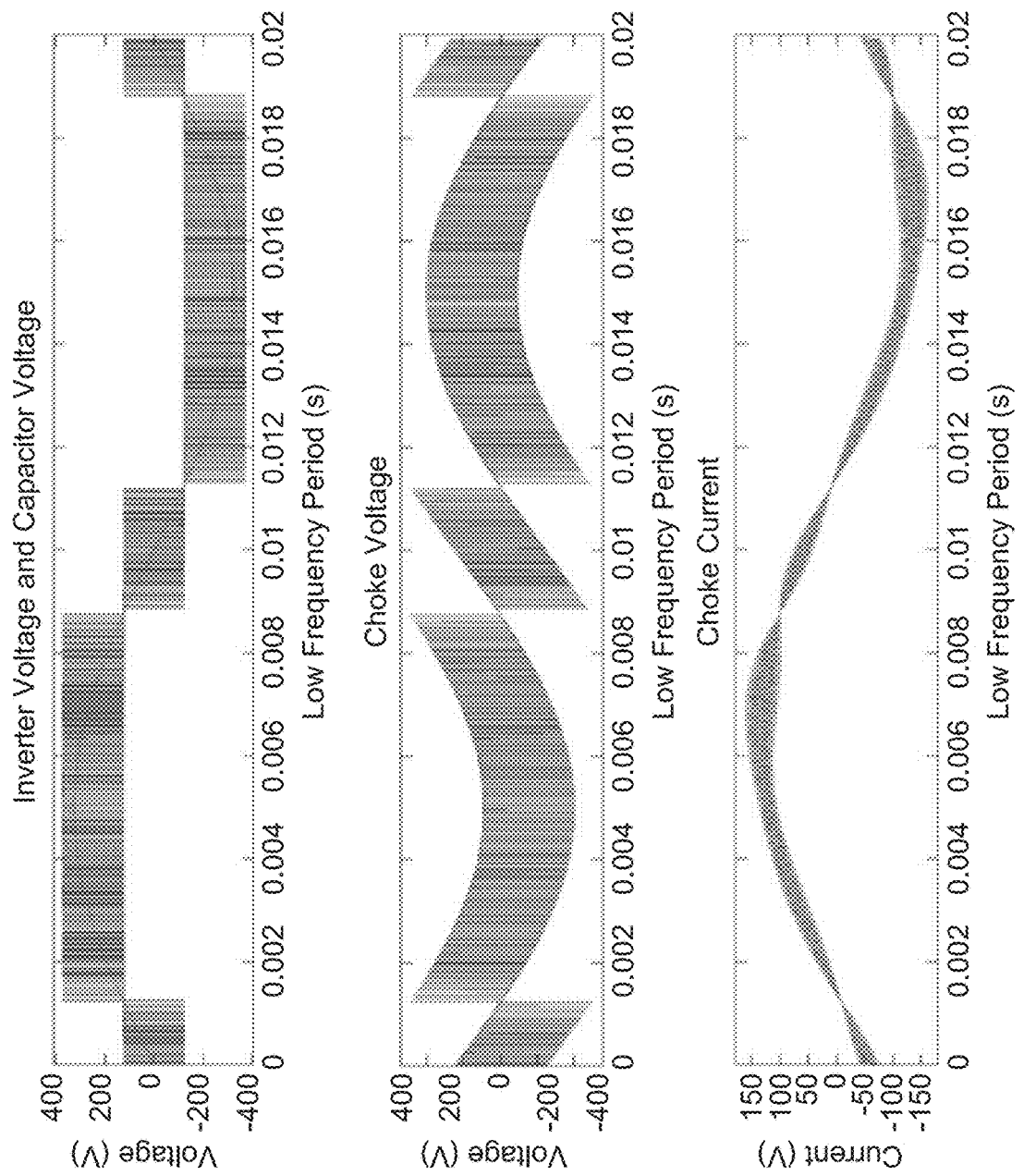
FIG. 2A is a graph showing a waveform of the two-phase inverter for 4-level bridge.

Combining two of them for power increasing of the system, two bridges/legs are parallel through two independent classic inductors as shown in FIGS. 1A and 2A, but it does not give any losses/volume/cost saving, simply double the unitary solution.

Figure 3:
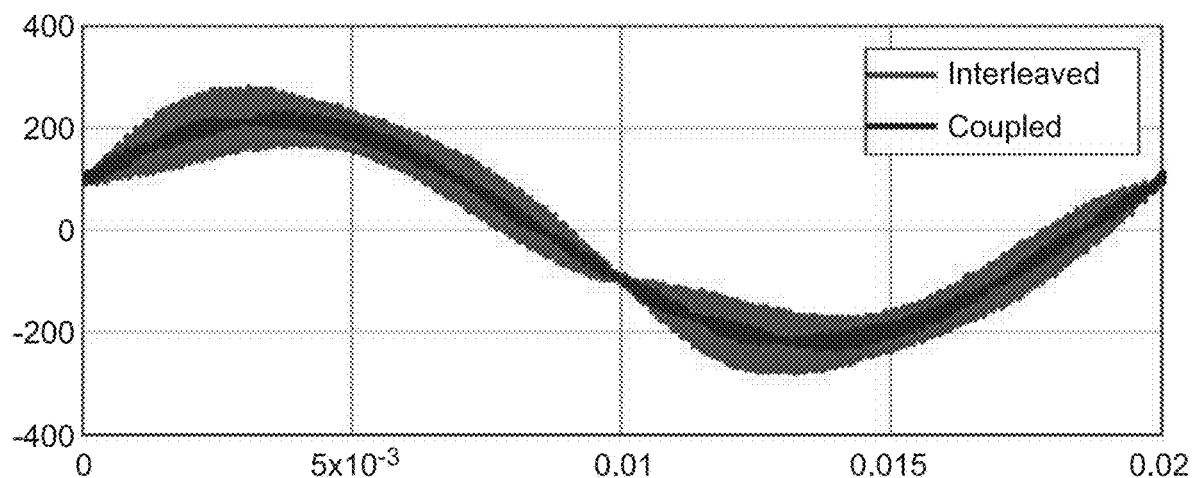
FIG. 3 is a graph showing outputs of the waveforms shown in FIGS. 1A and 2A.

Interleaving (shifting) the outputs of two paralleled converters with classic separated inductors does not change any waveforms nor current shape flowing through the inductors, so no advantage to the magnetics, their sizing and performances remain the same, which is shown in FIG. 3.

Figure 3A:
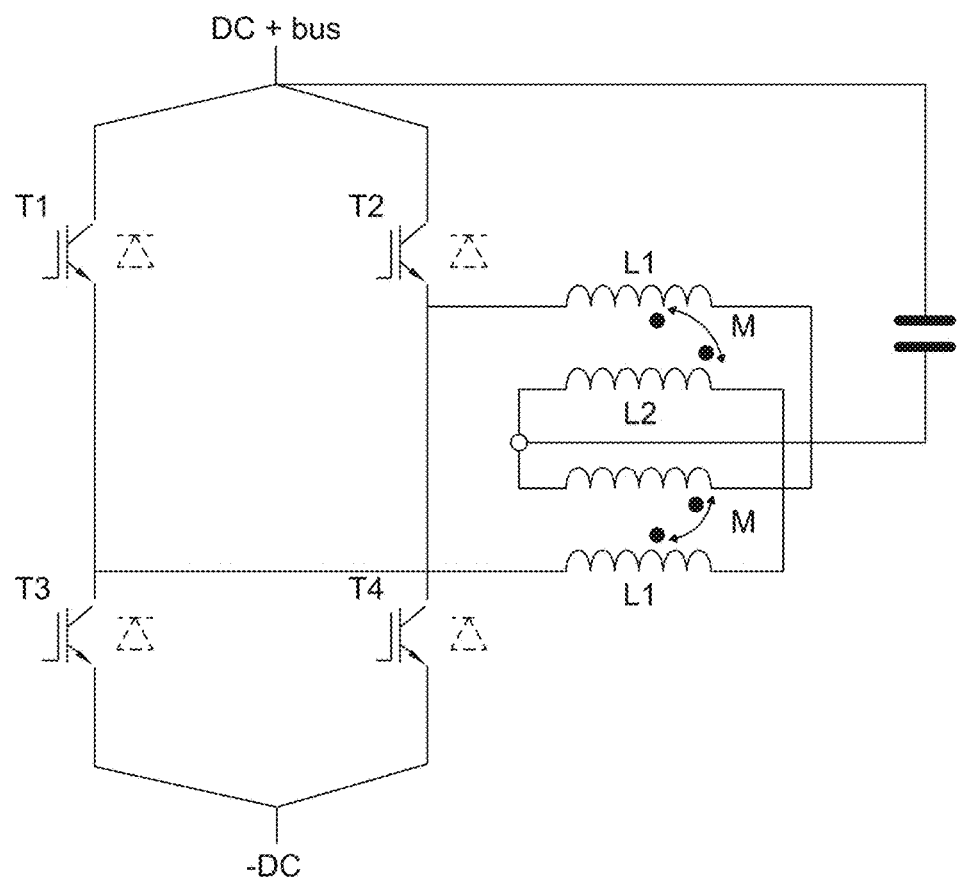
FIG. 3A is a schematic diagram of a coupled solution.

But replacing two classic filtering chokes by coupled solution on already interleaved bridges outputs apparently double the frequency of all waveforms in the system with the same kept switching frequency of the semiconductors, which cannot be raised itself due to semiconductor limitations, which is illustrated in FIG. 3A. This essentially doubles the frequency seen by the inductor and dramatically reduces its ripple, which is shown in FIG. 3, as well in the currents flowing everywhere in the system, therefore the amount of filtering required is dramatically reduced.

In one embodiment, two single-phase inverters are connected in parallel, with each inverter having a corresponding output inductor, respectively, providing self-inductance. The outputs are then magnetically coupled via a coupled inductor. With this arrangement, there is half as much current passing through each of inductors, as there would be passing through a conventional filter arrangement. Thus, in one configuration, losses may be approximately halved relative, for the same overall output current, reducing the amount of heat generated and providing more efficient power conversion.

In other embodiments, a solar inverter system includes two 3-phase inverters (bridges) connected in parallel. Corresponding phases (A, B, C) from each of the inverters are coupled via a coupled inductor. In some embodiments, the inverters of the solar inverter system may be DC-to-AC inverters (or "power conversion bridges"), each rated for up to 1 MW (as 2 MW of power cannot be handled by a single inverter). Each inverter produces a 3-phase output. The two bridges are connected in parallel and the 3-phase outputs of the 2 bridges are interleaved (180 degrees out of phase relative to each other). The inverters on their own may produce an unacceptably rough AC power waveform. Therefore, an AC filter module, consisting of inductor and capacitor components, is used to smooth the waveform.

To handle the level of power and power quality requirements, an AC filter would conventionally be large and costly. For example, a classical approach to this problem, even after much optimization, requires inductors that cost approximately 9% of the system cost and capacitors that are approximately 2% of the system cost. The inductor used in the classical approach also produces significant energy losses (around 4 kW), which inflates the required cooling system and adds additional cost and volume to the system.

Switching of the two 3-phase inverters in the example system may be interleaved, thereby doubling the switching frequency. This essentially doubles the frequency seen by the inductors and therefore the amount of filtering required is reduced. In various embodiments, for each of the two inverters, there is a core for each AC phase that provides self-inductance. For each AC phase, there is also a third core that provides a coupled inductance between the inverters (for each phase). Each of the self-inductors is positioned between each inverter and the respective coupled inductor, per phase.

The AC filter module thereby includes coupling between inverters and in some implementations also includes coupling between phases.

As discussed above, a solar inverter system may comprise two 3-phase inverters connected in parallel, but a similar approach consistent with principles of the invention can be taken with more than two 3-phase inverters and/or with two or more single phase or other multi-phase inverters.

The above-described electrical configurations can be implemented in many different embodiments, not limited to those described in further detail below.

In conventional inductor systems, the coils or windings are wrapped around a central core (often a straight cylindrical rod or a continuous loop or ring, doughnut). Embodiments of the present invention involve a unique winding geometry that is particularly suited for use in embodiments of an AC filter module.

In the case of three-phase inverters connected in parallel the single-phase concept works in the same manner but separately per each phase. Corresponding inverter legs forming three phases (A, B, C) from each of bridge 1 and bridge 2 are coupled via three separated single-phase coupled inductors.

The AC filter module thereby includes coupling between inverters. The windings geometry of embodiments of the present disclosure has been arranged in a unique manner. Additionally, the mechanical design of the AC filter module has multiple aspects that allow the technology to be practically and commercially realized. Overall the coupled inductor of embodiments of the present disclosure is about ⅓ the total mass and ½ the volume of the classical inductors when designed for equivalent losses.

Embodiments of the present disclosure are directed to an inductor configured to:
  reduce the high cost and large size of conventional filters for medium and high power converters;
  reduce high volume/weight of filter magnetics as well reducing capacitor bank by half;
  Reduce needed filtering inductance value in the ratio of 2 to 3;
  reduction flux and core losses by up to two to three times;
  reducing to almost zero EMI/RFI pollution as compared to classical leakage-based solutions—EMC compatibility issues fixed;
  reducing additional losses induced in neighborhood metal sheets of the cabinet cancelled;
  reducing or even cancel audible noise dramatically;
  reduce filter size and cost, through use of a compact configuration, with efficient use of magnetic materials for the core(s) and conductor materials for the windings;
  increasing power density (related to the above advantage);
  reducing losses due to lower current from the self-inductors being "upstream" of the coupled inductor;
  reducing losses due to the interleaved physical arrangement of the windings on the coupled inductor cores;
  reducing losses result in less heat generation, and lower requirement for cooling;
  and
  supporting manufacturing feasibility of the cores and windings designed.

Embodiments of the present disclosure are directed to an inductor including:
  electrical arrangement of self-inductors and couplers, with self-inductors positioned between each bridge output or bridge phase output and the coupler;
  mechanical design of the AC filter module, with single or stacked coils from multiple inverters and/or phases and a coupled inductor in between each pair of individual inductors, i.e., the physical arrangement of the magnetic cores and coils, and mechanical integration of the self-inductors and coupler; and
  individual coil design, e.g., the shape of windings.

The above-described electrical configurations can be implemented in many different embodiments, not limited to those described below. In conventional inductors, the coils or windings are wrapped around a central core (often a straight rectangular shape). Inductors of the present embodiments include a unique winding geometry that is particularly suited for use in the present filter module.

Figure 4:
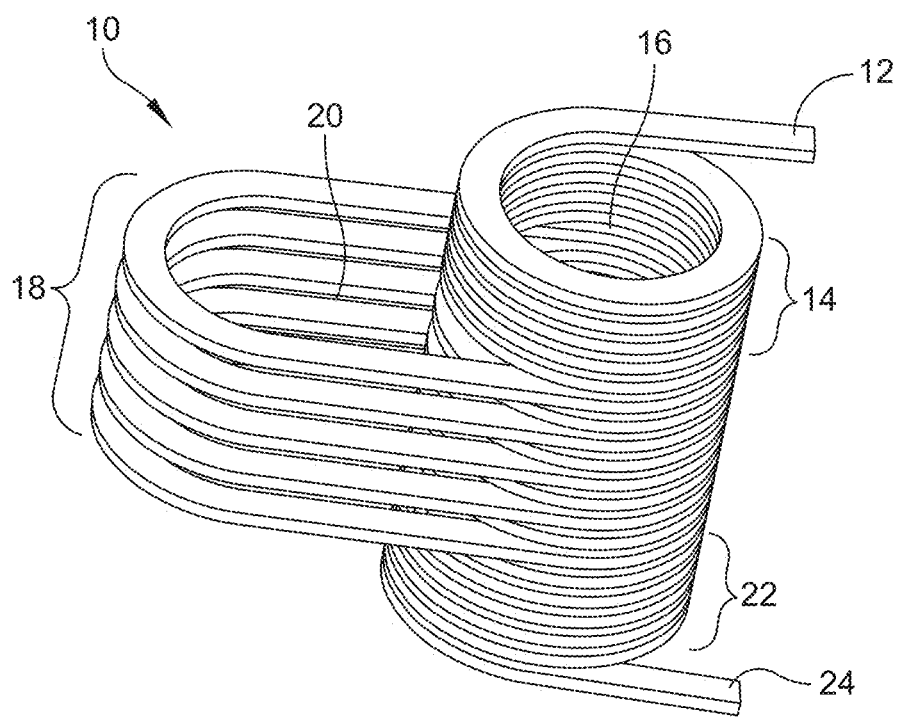
FIG. 4 is a perspective view of a coil winding of an embodiment of the present disclosure.

An example of such an inductor coil winding, generally indicated at 10, is shown in FIG. 4. The conductive material of the coil winding 10 (e.g. copper or aluminum) may have a rectangular cross-section as shown. In various embodiments, the conductive material may be one or more strands, and may be multi-strand transpose wire in certain embodiments, e.g., to achieve additional reduction in losses. The coil winding 10 is shaped to form a series of turns in a vertically stacked relation to form a cylinder for the main inductance, with every other turn at a middle of the coil winding shaped to form a series of concentric elongated turns in a vertically stacked relation.

Specifically, in the shown embodiment the inductor coil winding 10 includes a first terminal 12 and a series of first circular turns at 14 in a vertically stacked relation, with the series of first circular turns leading in from the first terminal and having a diameter allowing for an opening 16 within the series of first circular turns. The coil winding 10 further includes a series of elongated turns at 18 in a vertically stacked relation, with the series of elongated turns leading in from the series of first circular turns 14 and having a length greater than the diameter of the series of first circular turns, and allowing for an opening 20 within the series of elongated turns. In the shown embodiment, every other turn at a middle of the coil winding 10 is shaped to form the series of concentric elongated turns 18 in a vertically stacked relation. The coil winding 10 further includes a series of second circular turns at 22 in a vertical stacked relation, with the series of second circular turns leading in from the series of elongated turns 18 and having a diameter allowing for the opening 16 within the series of second circular turns. The coil winding 10 further includes a second terminal 24 leading out form the series of second circular turns 22.

Figure 6:
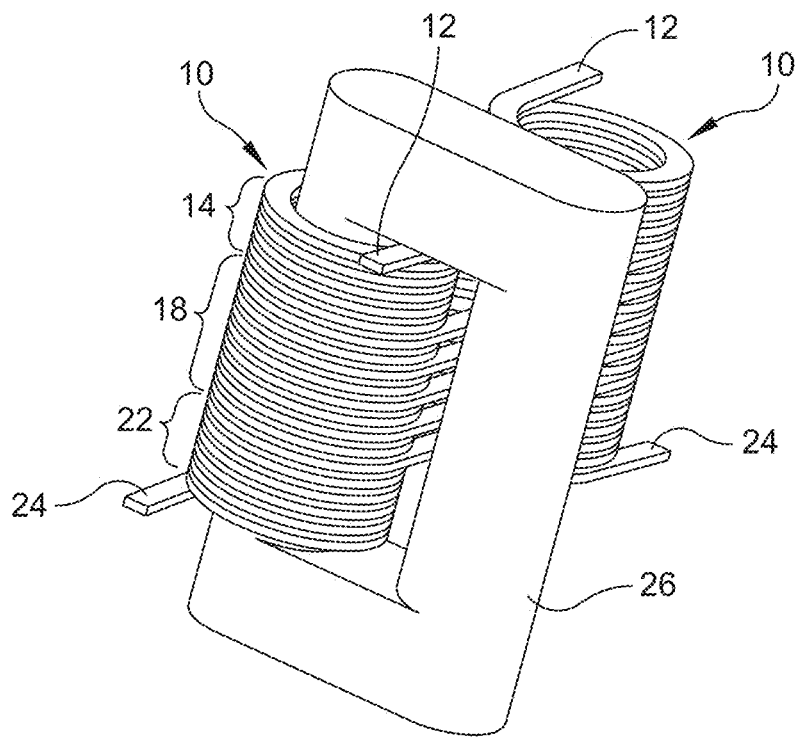
FIG. 6 is a perspective view of a coupled inductor core inserted in the first coil winding shown in FIG. 5 of an embodiment of the present disclosure.
Figure 7:
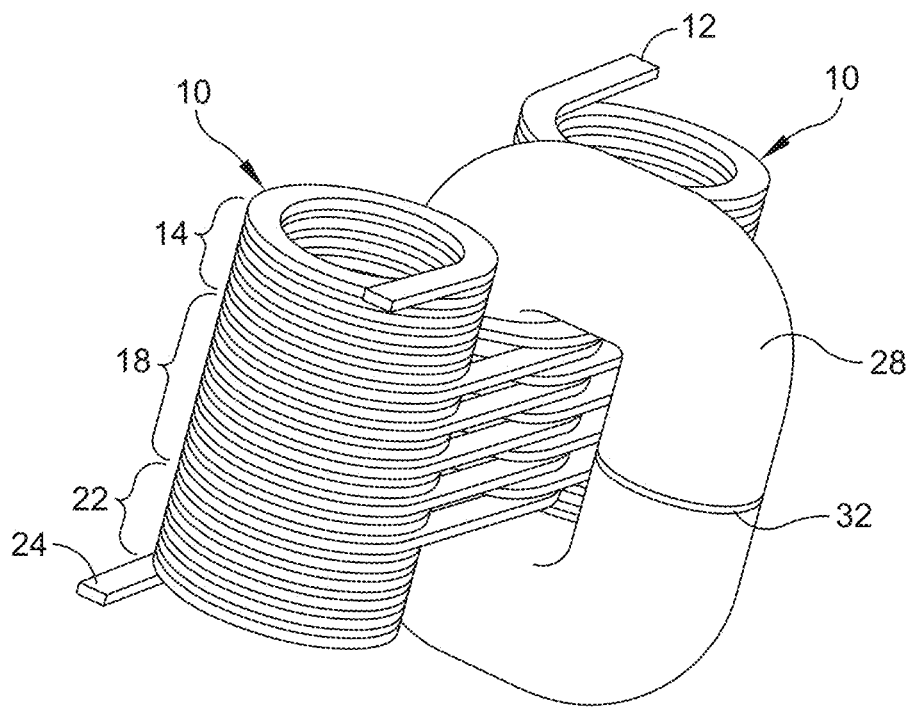
FIG. 7 is a perspective view of a coupled inductor core inserted into the intersection of the first coil winding and the second coil winding shown in FIG. 5 of an embodiment of the present disclosure.

The circular opening 16 accommodates a self-inductor core 26 (FIG. 6) and the elongated opening 20 accommodates a coupled inductor core 28 (FIG. 7). The coupled inductor coil windings 10 also contribute to the self-inductance. In certain embodiments, the coil winding 10 may be generally coated in an electrically insulating material, such as a plastic, except for the terminals 12, 24.

Various embodiments of the geometry of the coil winding 10, with respect to the example illustrated in FIG. 4, offer particular advantages. The coil windings 10 are designed to integrate the self and coupled inductor cores 26, 28, and are designed in a space-efficient manner. The coil windings 10 can also be packed together tightly side-by-side because of their quasi-rectangular shape. The vertical structure of the coil windings 10 also allows good thermal contact with thermal plates, such as liquid-cooled thermal plates, which can be interposed between coil windings, for cooling the assembly.

Variations on the geometry of the coil winding 10 or quite different coil winding geometries can be used in various implementations of the present disclosure. For example, in some variations on the above coil winding geometry, the cross-section of the coil winding 10 may be non-rectangular. The number of turns for the main inductance and the coupled inductance can be varied. The shape of the coil windings 10 need not be as shown.

The conductive material of the coil winding 10 (e.g., copper or aluminum or clad metals) may have a rectangular cross-section as shown. For HF losses decreasing in high power coil windings with obviously large conductor section the CTC multistrand twisted wire is intended to be used.

As mentioned, the coil winding 10 is generally coated or wrapped in an electrically insulating material, except for the terminals 12, 24.

Figure 5:
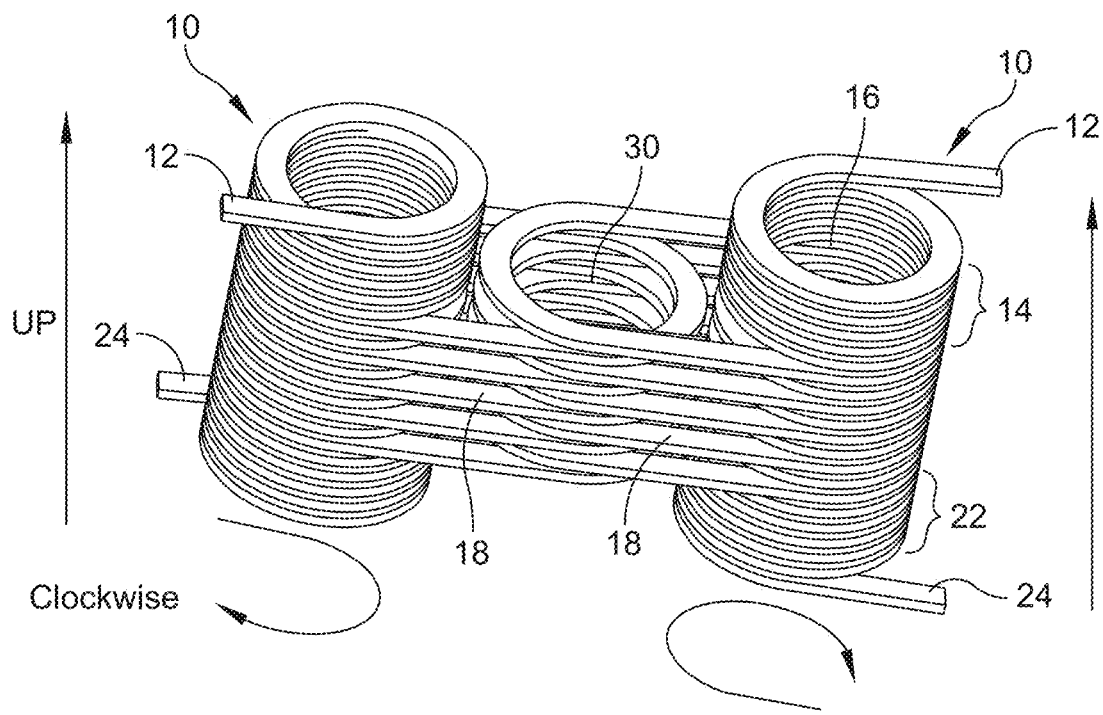
FIG. 5 is a perspective view of a first coil winding interconnected with a second coil winding of an embodiment of the present disclosure.

Referring to FIG. 5, the coil winding 10 shown in FIG. 4 represents a single coil, which is fed by a first bridge. A second bridge feeds similar second coil winding 10 that is superposed with the first coil winding so that the elongated turns 18 are interleaved to create a single circular opening 30. In the shown embodiment, each coil winding 10 is wound in a clockwise rotation when wound from the bottom of the coil winding to the top of the coil winding.

Referring to FIG. 6, self-inductance from the bridges is created by insertion of the low permeability self-inductor core 26 into the opening 16 of the first coil winding 10 as shown. The self-inductor core 26 is configured to pass through the series of first circular turns 14, the series of elongated turns 18 and the series of second circular turns 22. Similarly, although not shown in FIG. 6, another low permeability self-inductor core 26 is inserted into the opening 16 of the second coil winding 10. Thus, two separated cores 26 are inserted into two openings 16 of both coil windings 10 forming two separated self-inductances without any magnetic interactions between them.

Referring to FIG. 7, mutual inductance is created by insertion of the coupled inductor core 28 into intersection of both superposed coil windings 10. As shown, the coupled inductor core 28 is inserted into the opening 30 created by the interleaved elongated turns 18 of the first coil winding 10 and the second coil winding 10 shown in FIG. 5. The coupled inductor core 28 should be medium or high permeability one with air gap (one or more) inserted in the central part of a core limb, which is created by a gap shim 32.

Figure 8:
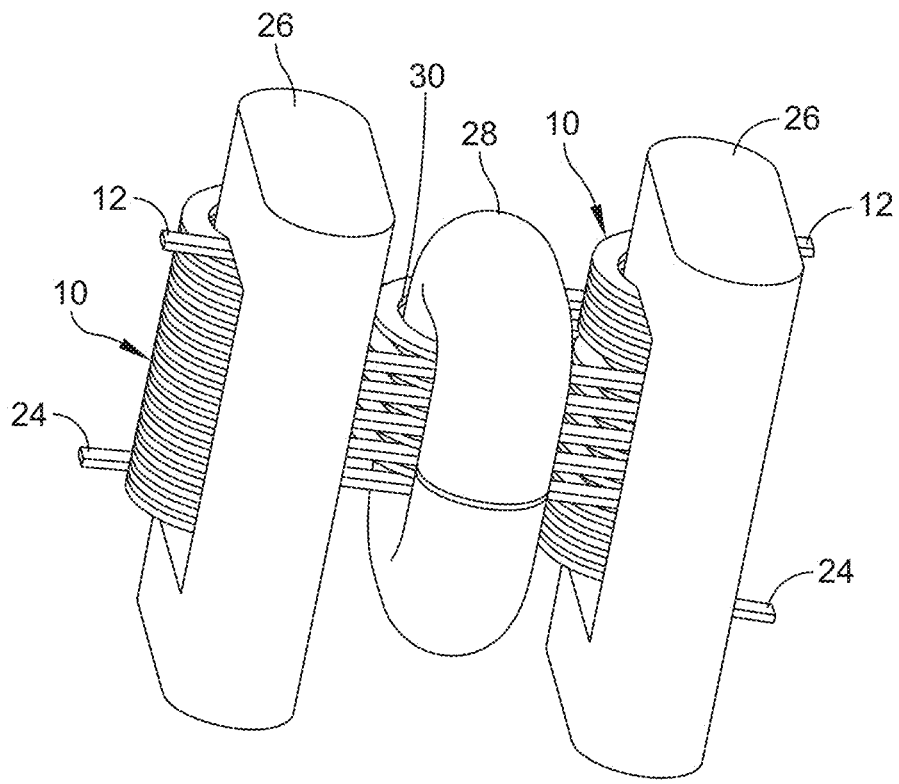
FIG. 8 is a perspective view of coupled inductor cores inserted into the first coil winding, the intersection of the first coil winding and the second coil winding, and the second coil winding.

Referring to FIG. 8, all three cores (two self-inductor cores 26 and coupled inductor core 28) are positioned to form two separated self-inductances and one mutual inductance of the coupled inductor set. This configuration permits independent control of self and mutual fluxes without any interactions between them which is opposite of classical approach to coupled inductors with leakage flux control can be superposed in part with the mutual flux in the main unique core of the regular solutions.

Figure 9:
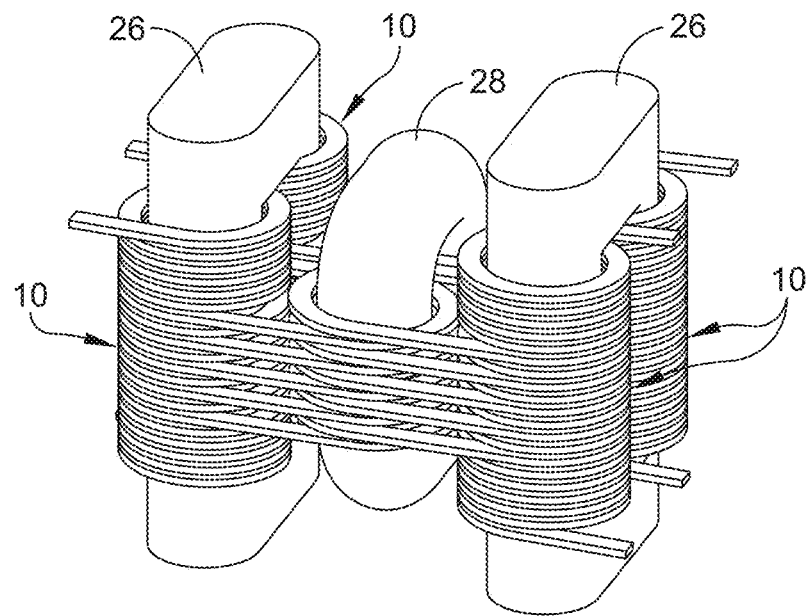
FIG. 9 is a perspective view of a completed inductor of an embodiment of the present disclosure.

Referring to FIG. 9, a second set of identically configured coil windings 10 are provided to correctly bias all cores 26, 28 when assembled. The first and second sets of coil windings 10 can be put in series or in parallel, forming full windings of the integrated self-inductor and coupled inductor cores 26, 28. This type of winding geometry offers particular advantages. They are designed to integrate both the self-inductance and coupler mutual inductance cores 26, 28, and are designed to stack in a space-efficient manner, with the main inductance turns of one coil winding 10 in the same plane as the coupled inductance turns of an adjacent coil winding.

Variations on the above coil winding geometry or quite different winding geometries can be used in various implementations of the present disclosure. In variations on the above winding geometry, the cross-section of the winding may be non-round or oval. The number of turns for the main self-inductance and the coupled mutual inductance can be varied and adjusted strictly to the design needs. In other winding geometries, the windings may not have a helical-like configuration, e.g., toroidal. They may, for example, have a planar structure or a more conventional geometry. The shape of the windings need not be as shown. The coil windings need not be two planes as shown—they can be in a single plane ore in multiple planes, means can be stacked by serial or parallel connection of unitary coils. Further, as will be discussed in greater detail below with reference to FIG. 11B, the coil windings can be wound in a clockwise direction and in a counterclockwise direction to achieve three-phase power configurations to reduce extreme voltage at the terminals when winding the coil windings from a bottom of the coil winding to a top of the coil winding.

Figure 10:
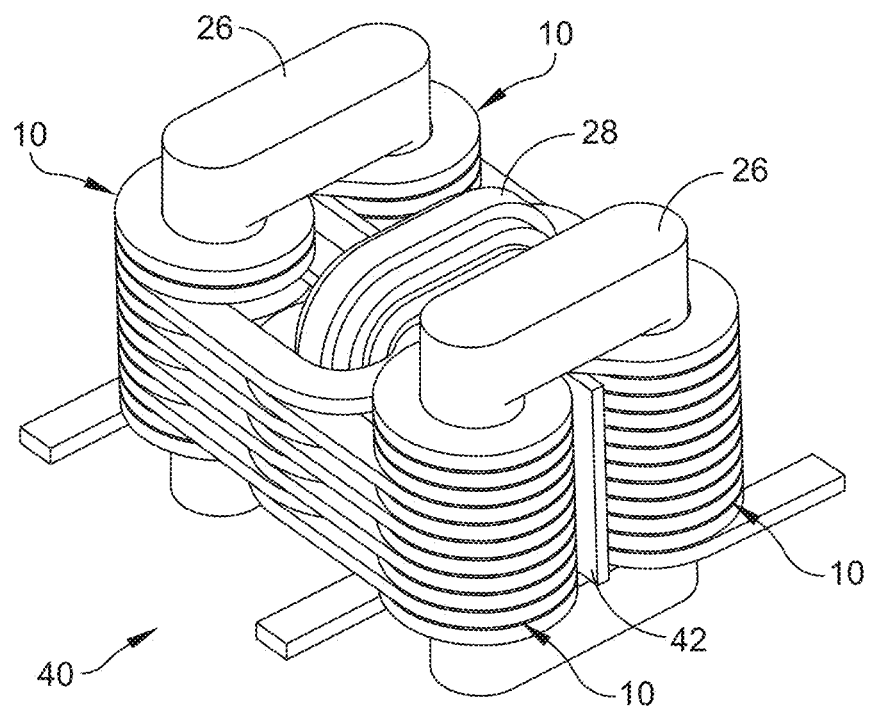
FIG. 10 is a perspective view of an integrated coupled inductor assembly of the present disclosure.

Referring additionally to FIG. 10, an integrated coupled inductor assembly, generally indicated at 40, is provided for single-phase output of an inverter pair with connections to each inverter bridge with planar multi coil structure. The inductor assembly 40 includes several coil windings, each indicated at 10, with circular openings to accommodate the two self-inductor cores 26, stacked in two interleaved stacks. The inductor assembly 40 further includes an interleaved opening to accommodate the coupled inductor core 28. Each coil winding 10 includes the first terminal 12, the series of first circular turns at 14 in a vertically stacked relation, with the series of first circular turns leading in from the first terminal and having a diameter allowing for an opening 16 within the series of first circular turns, the series of elongated turns at 18 in a vertically stacked relation, with the series of elongated turns leading in from the series of first circular turns 14 and having a length greater than the diameter of the series of first circular turns, and allowing for an opening 20 within the series of elongated turns, the series of second circular turns at 22 in a vertical stacked relation, with the series of second circular turns leading in from the series of elongated turns 18 and having a diameter allowing for the opening 16 within the series of second circular turns, and the second terminal 24 leading out form the series of second circular turns 22.

The self-inductance turns of the coil windings 10 connected to a first bridge, i.e., the series of first circular turns 14, portions of the series of elongated turns 18, and the series of second circular turns 22, are wound around a first self-inductance core 26. Similarly, self-inductance turns of the other coil windings 10 connected to a second bridge, i.e., the series of first circular turns 14, portions of the series of elongated turns 18, and the series of second circular turns 22, are wound around a self-inductance core 26. All coil windings 10 are wound around the coupled inductor core 28, i.e., the series of elongated turns 18.

There are multiple coil windings 10 in parallel surrounding the core which tends to reduce or minimize current crowding which can occur due to proximity of the windings to the magnetic material (cores) and other conductors (windings).

For a pair of inverters with three-phase (interleaved) output, three separate mechanical assemblies like the inductor assembly 40 shown in FIG. 10 could be used.

The flat/planar structure of the coil windings also allows good thermal contact with liquid-cooled thermal plates, indicated at 42, which can be interposed between the coil windings, for cooling the assembly. The input and output terminals can be conveniently located at almost any desired location around the perimeter of the coil winding. Often with conventional windings one terminal is located inside the coil winding where it is less accessible.

Two symmetrical external rod cores, building and sizing the self-inductance values of the coupled inductor, are designed with magnetic materials resulting in very low permeability in the range of 10 to 16 for high power conversion range of few MW. The iron powder or powder alloys can be used, as well as gapped laminated steels. The central core, forming and sizing the mutual inductance value, has to show resulting medium permeability, in the range of 300 to 550 for the same high-power system. Laminated materials are privileged, like amorphous and nanocrystalline or thin gauges of Cold Rolled Grain Oriented (CRGO) steels, permalloys/molypermalloys can be also used, but their cost can go too high due to the Nickel content. Pillars and yokes forming the core can be rectangular or wound stepped, cut and assembled with the gaps to adjust resulting permeability of the core.

As mentioned above, in the inductor assembly 40 shown in FIGS. 9 and 10, the coil windings 10 are tightly packed close together. This reduces the size of the cores and amount of magnetic material that is needed, and reduces losses. The magnetic material in the pairs of phases is shared. With this arrangement there are improved compensation and cancellation of noise between all coils.

The assembly with single vertical non-stacked coils address the issues identified above. But there are important improvements embodiments of the coil windings are further configured to address:
insulation and partial discharge issue;
high transversal cap value issue; and
HF current sharing between stacked horizontal coils.

Regarding insulation, partial discharge and high cap value issues, the unitary coil windings of the coupled integrated inductor should be wound in opposite direction clockwise/counter clockwise and stacked touching the surfaces of the turns with much lower potential differences reduced to almost zero at the coil terminals, where the inductor coil winding develops full high voltage drop.

Figure 11A:
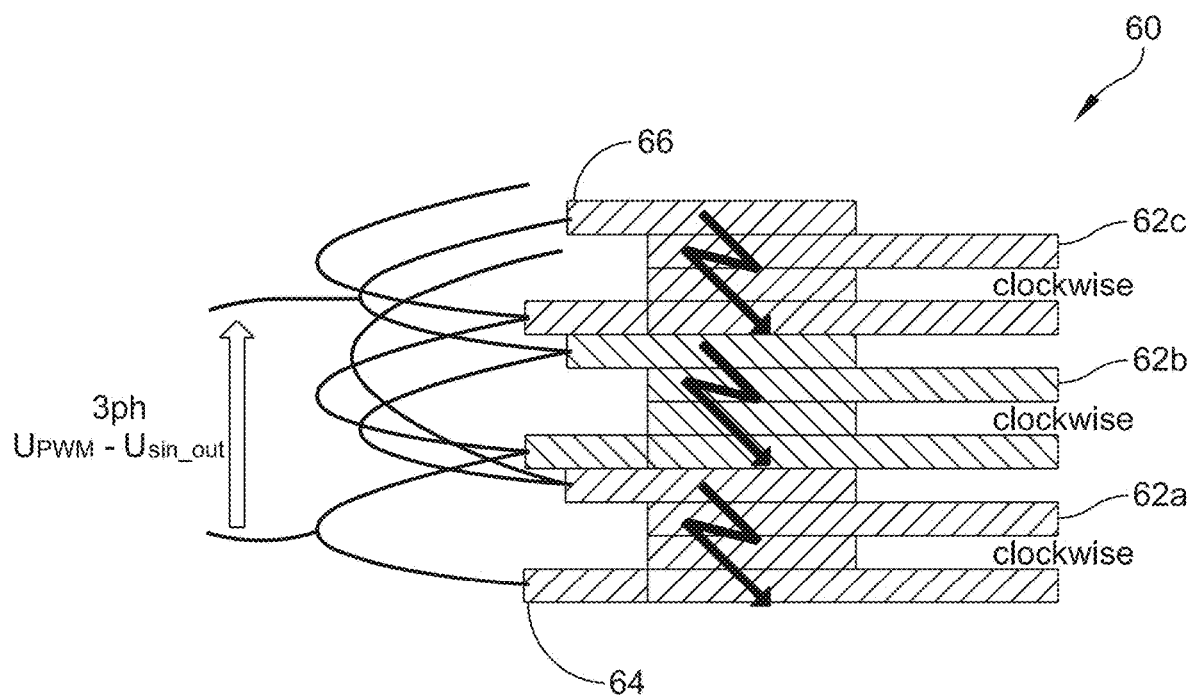
FIG. 11A illustrates a schematic view of an integrated coupled inductor assembly having coil windings wound in a clockwise direction.

FIG. 11A illustrates an integrated coupled inductor assembly 60 having three stacked coil windings 62a, 62b, 62c. The inductor assembly 60 is configured so that each coil winding 62a, 62b, 62c is wound in a clockwise direction and to produce three-phase power output. The coil windings 62a, 62c produce extreme voltage on terminals 64, 66, which is undesirable.

Figure 11B:
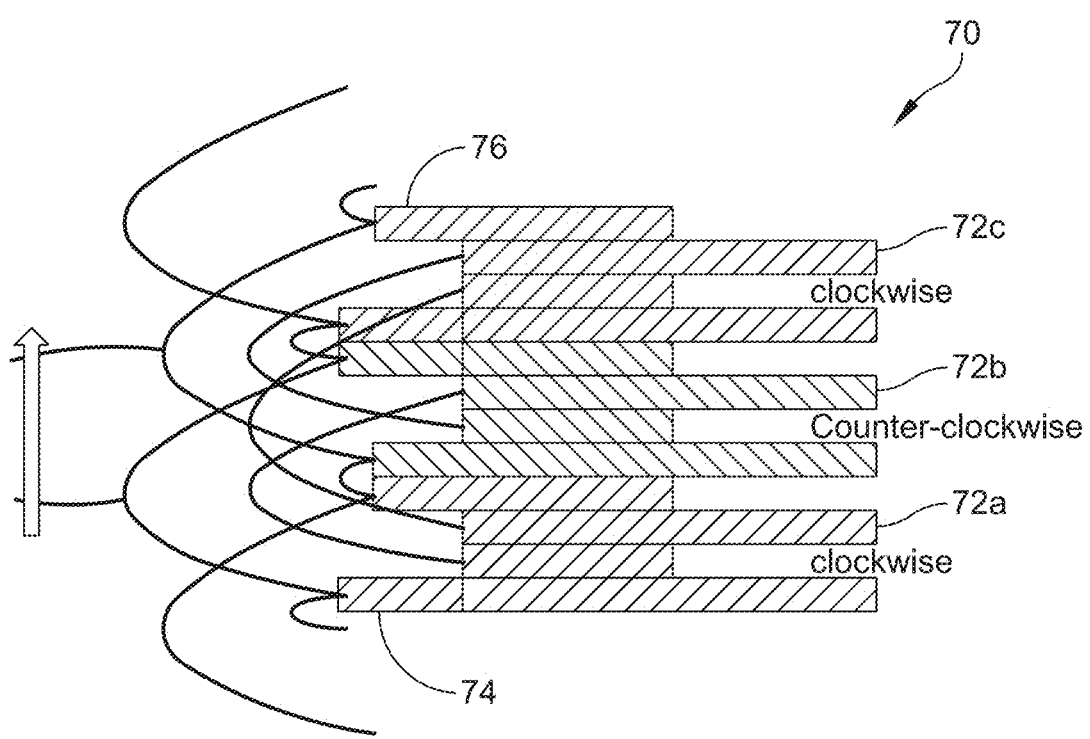
FIG. 11B illustrates a schematic view of an integrated coupled inductor assembly having coil windings wound in a clockwise direction, a counterclockwise direction and a clockwise direction.

FIG. 11B illustrates an integrated coupled inductor assembly 70 having three stacked coil windings 72a, 72b, 72c, which are configured to eliminate the unwanted extreme voltage exhibited by inductor assembly 60. The inductor assembly 70 is configured so that a first coil winding 72a is wound in a clockwise direction, a second coil winding 72b is wound in a counterclockwise direction and a third coil winding 72c is wound in a clockwise direction. The inductor assembly 70 is configured to produce three-phase power output. The coil windings 72a, 72b, 72c of inductor assembly 70 reduce the voltage on terminals 74, 76 to nearly zero, which is desirable.

The currents of two legs can be expressed as resolution of the set of differential equations:

$$V1 - V_{out} := L1\frac{dI1}{dt} + M \cdot \frac{dI2}{dt}$$

$$V2 - V_{out} := L2\frac{dI2}{dt} + M \cdot \frac{dI1}{dt}$$

$$M := k(L1 \cdot L2)^{0.5}$$

where V1 and V2 are shifted voltages of the corresponding leg1 and leg2, Vout is the output voltage on the capacitor and K is the coupling factor which can take values between −1 and 1. Positive values of K factor give direct coupling, negative values give inverse coupling of the chokes. Inverse coupling is capable of doubling the frequency of the ripple current where switching frequency of the bridges remains the same. A lot of attention must be put to optimize the value of the K factor as with small values the inverse coupling will be insufficient, but with too high values the ripple current, even still with multiplied frequency, can also rise too much. The coupling has to be sufficient but should remain as weak as possible.

Examples how this concept can be implemented in various designs of different converters. For example, voltages and currents obtained in 3-level current inverter are the same in the case of 4-level voltage inverter, which confirms that presented concept works whatever the power converter type or topology. In all cases the dramatical current ripple decreasing and apparent effect of switching frequency multiplication can be observed resulting in smaller, lighter and cheaper filter design.

Embodiments of the concepts disclosed herein can be used in three-phase systems (multiple single-phase inverters).

Embodiments of the concepts disclosed herein can be used with more than two converters (e.g., n converters).

Embodiments of the concepts disclosed herein are applicable to DC-AC or AC-DC or bidirectional inverters.

Embodiments of the concepts disclosed herein are applicable in many power conversion devices, and can have large benefits to many applications and markets.

Embodiments of the inductors disclosed herein provide a fully optimized solution for extremely large scope of all type of medium and high power, single- or three-phase converters. Based on large choice of classic non-toroidal shapes of magnetic cores and conductors can answer to needs of almost all applications, as example 100 kW/3 U module.

The integrated coupled inductor according to presented concept has been realized according to the embodiment shown in FIG. 10, but with totally different coil geometry.

Embodiments of the disclosure enable outstanding electrical performances and losses reduction also a dramatical volume/weight and cost reduction over classical solution was clearly proven, spectacular almost−50% gain achieved.

Embodiments of the present disclosure provide a number of advantages, including the reduction of an AC filter size and cost, through use of a compact configuration, with efficient use of magnetic inductor and conductor materials. Examples and embodiments of AC filter/inductor assemblies described herein have the effect of providing an increased power density. In addition, they may provide reduced losses due to lower current from the self-inductors being "upstream" of the coupled inductor, and reduced losses due to the interleaved physical arrangement of the windings on the coupled inductor cores. The reduced losses result in less heat generation, and reduced requirement for cooling. The design of the cores and windings provide for simple assembly, supporting manufacturing feasibility. Further, the design allows for the use of liquid cooling of a filter/inductor, which is generally more cost-efficient than air-cooling, and allows for greater control or optimization of the degree of thermal transfer.

In various embodiments, windings, arrangements, assemblies, and modules in accord with aspects of those illustrated in FIGS. 4-10 may be beneficially applied to provide electrical filtering to any of numerous power converter applications, including those of solar inverters as described herein, but also of DC-to-DC converters, AC-to-DC converters, and other DC-to-AC converters for applications other than solar. Such arrangements may provide compact and efficient filtering to remove high frequency components from an electrical waveform at inputs and/or outputs of various power converters. Such arrangements may also be beneficially adapted to differing scale of power conversion equipment than those discussed herein. For example, power factor correction (PFC) equipment, uninterruptible power supply (UPS) equipment, and the like.

Having described above several aspects of at least one embodiment, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only, and the scope of the invention should be determined from proper construction of the appended claims, and their equivalents.

What is claimed is:

1. A filter assembly comprising:
a first self-inductance core;
a second self-inductance core;
a coupled inductor core;
a first plurality of inductor coil windings, each of the first plurality of inductor coil windings having a series of first turns in a vertically stacked relation around the first self-inductance core, and a series of second turns in a vertically stacked relation around the first self-inductance core and the coupled inductor core; and
a second plurality of inductor coil windings, each of the second plurality of inductor coil windings having a series of first turns in a vertically stacked relation around the second self-inductance core, and a series of second turns in a vertically stacked relation around the second self-inductance core and the coupled inductor core,
wherein the second turns of each of the first plurality of inductor coil windings are elongated turns and the second turns of each of the second plurality of inductor coil windings are elongated turns, and
wherein the second turns of each of the first plurality of inductor coil windings and the second turns of each of the second plurality of inductor coil windings are positioned at a middle of the coil winding.

2. The filter assembly of claim 1, wherein the first self-inductance core, the second self-inductance core, and the coupled inductor core each include three limbs, one limb for each of three phases.

3. The filter assembly of claim 1, wherein the second turns of each of the first plurality of inductor coil windings and the second turns of each of the second plurality of inductor coil windings are every other turn.

4. The filter assembly of claim 1, wherein the first plurality of inductor coil windings is configured to electrically connect to a first inverter at a first terminal to receive an alternating current output from the first inverter and the second plurality of inductor coil windings is configured to electrically connect to a second inverter at a second terminal to receive an alternating current output from the second inverter.

5. The filter assembly of claim 4, wherein the first plurality of inductor coil windings is electrically connected to the second plurality of inductor coil windings at a third terminal configured to provide a combined alternating current from the first and second inverter.

6. An inductor coil winding comprising:
a first terminal;
a series of first circular turns in a vertically stacked relation, the series of first circular turns leading in from the first terminal and having a diameter allowing for an opening within the series of first circular turns;
a series of elongated turns in a vertically stacked relation, the series of elongated turns leading in from the series of first circular turns and having a length greater than the diameter of the series of circular turns, and allowing for an opening within the series of elongated turns;
a series of second circular turns in a vertical stacked relation, the series of second circular turns leading in from the series of elongated turns and having a diameter allowing for an opening within the series of second circular turns, the openings of the first and second circular turns being aligned with one another; and
a second terminal, the second terminal leading out form the series of second circular turns.

7. The inductor coil winding of claim 6, wherein the series of first circular turns and the series of second circular turns provide main inductance.

8. The inductor coil winding of claim 7, wherein the series of elongated turns provides coupled inductance.

9. The inductor coil winding of claim 8, wherein the first terminal is an input terminal electrically connected to an output of an inverter to receive current from the inverter.

10. The inductor coil winding of claim 6, further comprising a self-inductance core in the opening within the series of first circular turns and the series of second circular turns and a coupled core in the opening within the series of elongated turns, the coupled core being configured to provide a magnetic coupling to another inductor coil winding.

11. The inductor coil winding of claim 6, wherein the series of elongated turns are located at a middle of the inductor coil winding.

12. The inductor coil winding of claim 11, wherein the series of elongated turns is achieved by every other turn.

13. A method of assembling a filter assembly, the method comprising:
   interleaving a first inductor coil winding with a second inductor coil winding, each of the first and second inductor coil windings including
      a first terminal,
      a series of first circular turns in a vertically stacked relation, the series of first circular turns leading in from the first terminal and having a diameter allowing for an opening within the series of first circular turns,
      a series of elongated turns in a vertically stacked relation, the series of elongated turns leading in from the series of first circular turns and having a length greater than the diameter of the series of circular turns, and allowing for an opening within the series of elongated turns,
      a series of second circular turns in a vertical stacked relation, the series of second circular turns leading in from the series of elongated turns and having a diameter for allowing an opening within the series of second circular turns, the openings of the first and second circular turns being aligned with one another, and
      a second terminal, the second terminal leading out form the series of second circular turns;
   positioning a first self-inductance core in first and second openings of the first inductor coil winding;
   positioning a second self-inductance core in the first and second openings of the second inductor coil winding; and
   positioning a coupled inductor core in the opening within the series of elongated turns.

14. A filter assembly comprising:
   a first self-inductance core;
   a second self-inductance core;
   a coupled inductor core;
   a first inductor coil winding having a series of first turns in a vertically stacked relation around the first self-inductance core and a series of second turns in a vertically stacked relation around the first self-inductance core and the coupled inductor core, the first inductor coil winding being wound in a first direction;
   a second inductor coil winding having a series of first turns in a vertically stacked relation around the second self-inductance core and a series of second turns in a vertically stacked relation around the second self-inductance core and the coupled inductor core, the second inductor coil winding being wound in a second direction, which is opposite the first direction; and
   a third inductor coil winding having a series of first turns in a vertically stacked relation around the first self-inductance core and a series of second turns in a vertically stacked relation around the first self-inductance core and the coupled inductor core, the third inductor coil winding being wound in a first direction,
   wherein the second inductor coil is positioned between the first inductor coil and the third inductor coil.

15. The filter assembly of claim 14, wherein the first self-inductance core, the second self-inductance core, and the coupled inductor core each include three limbs, one limb for each of three phases.

16. The filter assembly of claim 14, wherein the second turns of first inductor coil winding are elongated turns and the second turns of the second inductor coil winding are elongated turns.

17. The filter assembly of claim 16, wherein the second turns of the first inductor coil winding and the second turns of the second inductor coil winding are positioned at a middle of the coil winding, and the second turns of the first inductor coil winding and the second turns of the second inductor coil winding are every other turn.

18. The filter assembly of claim 14, wherein the first inductor coil winding is configured to electrically connect to a first inverter at a first terminal to receive an alternating current output from the first inverter and the second inductor coil winding is configured to electrically connect to a second inverter at a second terminal to receive an alternating current output from the second inverter.

* * * * *